United States Patent
Schuh

(10) Patent No.: US 9,179,554 B2
(45) Date of Patent: Nov. 3, 2015

(54) APPLIANCE DISPLAYS HAVING MODULAR LIGHT GUIDES AND METHODS OF ASSEMBLING THE SAME

(71) Applicant: Whirlpool Corporation, Benton Harbor, MI (US)

(72) Inventor: Eric Joseph Schuh, Stevensville, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 121 days.

(21) Appl. No.: 13/859,074

(22) Filed: Apr. 9, 2013

(65) Prior Publication Data

US 2014/0301106 A1 Oct. 9, 2014

(51) Int. Cl.
*F21V 8/00* (2006.01)
*H05K 3/30* (2006.01)
*D06F 39/00* (2006.01)

(52) U.S. Cl.
CPC ............... *H05K 3/30* (2013.01); *D06F 39/005* (2013.01); *Y10T 29/4913* (2015.01)

(58) Field of Classification Search
CPC .................................................. G02B 6/0021
USPC .......... 362/23.01, 23.07, 23.09, 23.11, 23.12, 362/23.16, 23.18, 92, 97.1, 97.3, 249.02, 362/511, 555, 561, 613, 631–634, 800; 40/204, 367
See application file for complete search history.

(56) References Cited

U.S. PATENT DOCUMENTS

| | | | |
|---|---|---|---|
| 5,269,977 A | 12/1993 | Nakahashi et al. | |
| 6,598,987 B1 | 7/2003 | Parikka | |
| 7,175,304 B2 | 2/2007 | Wadia et al. | |
| 7,923,654 B2 | 4/2011 | Zeijlon et al. | |
| 8,178,802 B2 | 5/2012 | Roose et al. | |
| 2005/0145468 A1* | 7/2005 | Kim | 200/296 |
| 2005/0185113 A1* | 8/2005 | Weindorf et al. | 349/71 |
| 2005/0264889 A1 | 12/2005 | Gotoh et al. | |
| 2007/0006493 A1* | 1/2007 | Eberwein | 40/204 |
| 2007/0019435 A1* | 1/2007 | Sakurai et al. | 362/611 |
| 2007/0035842 A1 | 2/2007 | Suh et al. | |

(Continued)

FOREIGN PATENT DOCUMENTS

| | | |
|---|---|---|
| CN | 201269489 Y | 7/2009 |
| CN | 101737720 A | 6/2010 |
| CN | 201540426 U | 8/2010 |
| DE | 10201280 A1 | 9/2002 |
| KR | 100859142 B1 | 9/2008 |
| TW | 200935146 A | 8/2009 |

(Continued)

OTHER PUBLICATIONS

European Patent Application No. 14162095.5 filed Mar. 27, 2014, Applicant: Whirlpool Corporation. European Search Report re: same, mail date Sep. 30, 2014.

*Primary Examiner* — Douglas W Owens
*Assistant Examiner* — Pedro C Fernandez

(57) ABSTRACT

Example appliance displays having modular light guides and methods of assembling the same are disclosed. An example appliance display includes a printed circuit board having a side-fire light emitting diode attached to a surface of the printed circuit board, a frame having a plurality of heat stakes to operatively connect the printed circuit board to the frame, and a light guide inserted into an opening defined in the frame, wherein the light guide guides light emitted by the light emitting diode through the opening defined in the frame, and wherein the printed circuit board retains the light guide in the opening when the printed circuit board is heat staked to the frame.

16 Claims, 3 Drawing Sheets

(56) References Cited

U.S. PATENT DOCUMENTS

| | | |
|---|---|---|
| 2009/0091906 A1 | 4/2009 | Arione et al. |
| 2009/0179862 A1* | 7/2009 | Strong, IV .................... 345/169 |
| 2010/0025214 A1* | 2/2010 | Roose et al. .................. 200/5 A |
| 2010/0026703 A1 | 2/2010 | Parker |
| 2010/0142219 A1 | 6/2010 | Chung |
| 2010/0213041 A1* | 8/2010 | Chen et al. .................... 200/314 |
| 2010/0232138 A1 | 9/2010 | Tsai |
| 2011/0122649 A1 | 5/2011 | Wen |
| 2011/0157870 A1 | 6/2011 | Liu et al. |
| 2012/0069595 A1* | 3/2012 | Catalano ....................... 362/555 |

FOREIGN PATENT DOCUMENTS

| | | |
|---|---|---|
| TW | 200938908 A | 9/2009 |
| TW | 200938910 A | 9/2009 |
| TW | 200949158 A | 12/2009 |
| TW | 200949370 A | 12/2009 |
| TW | 200949371 A | 12/2009 |
| TW | 200949778 A | 12/2009 |
| TW | 201113921 A | 4/2011 |
| TW | 201116761 A | 5/2011 |
| WO | 2004068448 A1 | 11/2006 |

\* cited by examiner

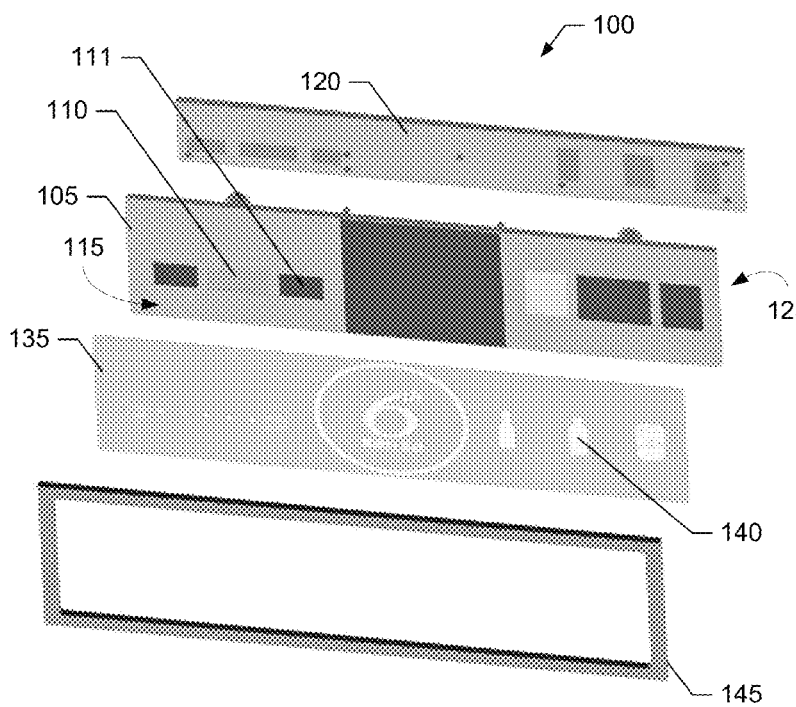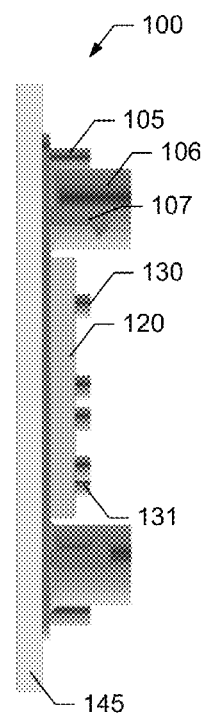
FIG. 1  FIG. 2
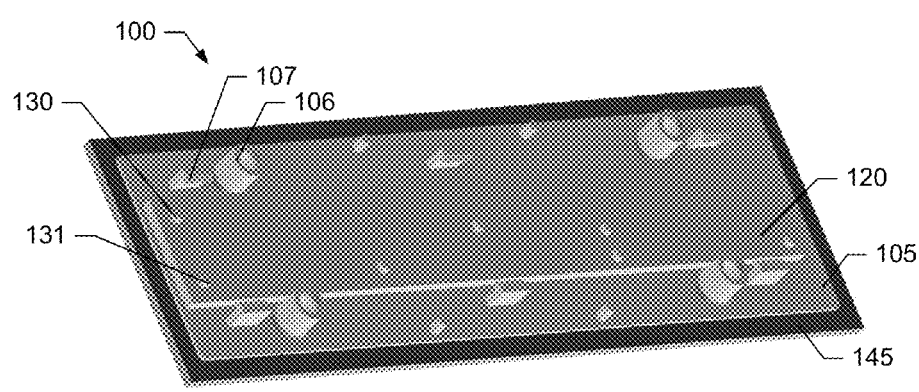
FIG. 3

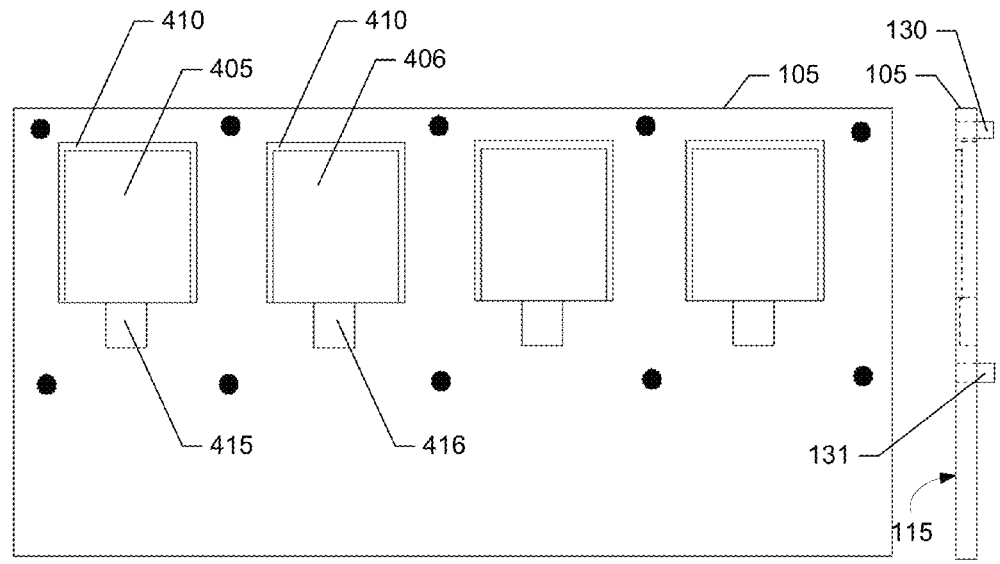
FIG. 4          FIG. 5
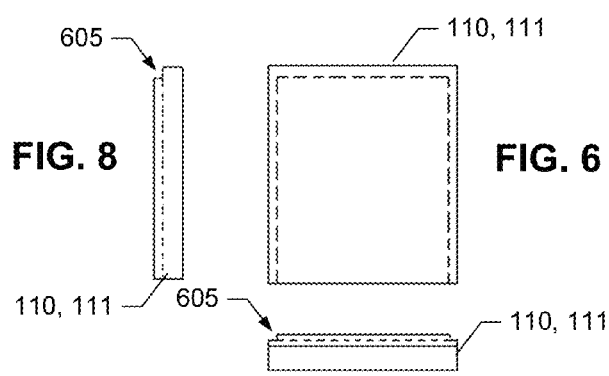
FIG. 8   FIG. 6
FIG. 7

APPLIANCE DISPLAYS HAVING MODULAR LIGHT GUIDES AND METHODS OF ASSEMBLING THE SAME

FIELD OF THE DISCLOSURE

This disclosure relates generally to appliance displays, and, more particularly, to appliance displays having modular light guides and methods of assembling the same.

BACKGROUND

Today, some appliance displays are constructed using a sheet of light guides that is positioned between a printed circuit board and a display surface. Side-fire light emitting diodes on the printed circuit board emit light into respective ones of the light guides to emit light through respective openings defined in the display surface. However, such light guide sheets are often prohibitively expensive for appliance displays having few illuminated display elements. Other appliance displays are constructed using light boxes defined in a frame that direct light emitted by light emitting diodes on a printed circuit board through respective openings defined in a display surface. To allow such appliance displays to include capacitive touch capabilities, capacitive extenders are placed between the display surface and the printed circuit board. However, over time such capacitive extenders may cause false key presses due to thermal cycles.

BRIEF DESCRIPTION OF THE DRAWINGS

FIG. 1 is an exploded view of an appliance display constructed in accordance with the teachings of this disclosure.

FIG. 2 is a side-view of the appliance display of FIG. 1.

FIG. 3 is a rear-view of the appliance display of FIG. 1.

FIGS. 4 and 5 are respectively top- and side-views of the frame of FIGS. 1-3.

FIGS. 6-8 are respectively top-, end- and side-views of the light guides of FIGS. 1-3.

DETAILED DESCRIPTION

Figure 9:
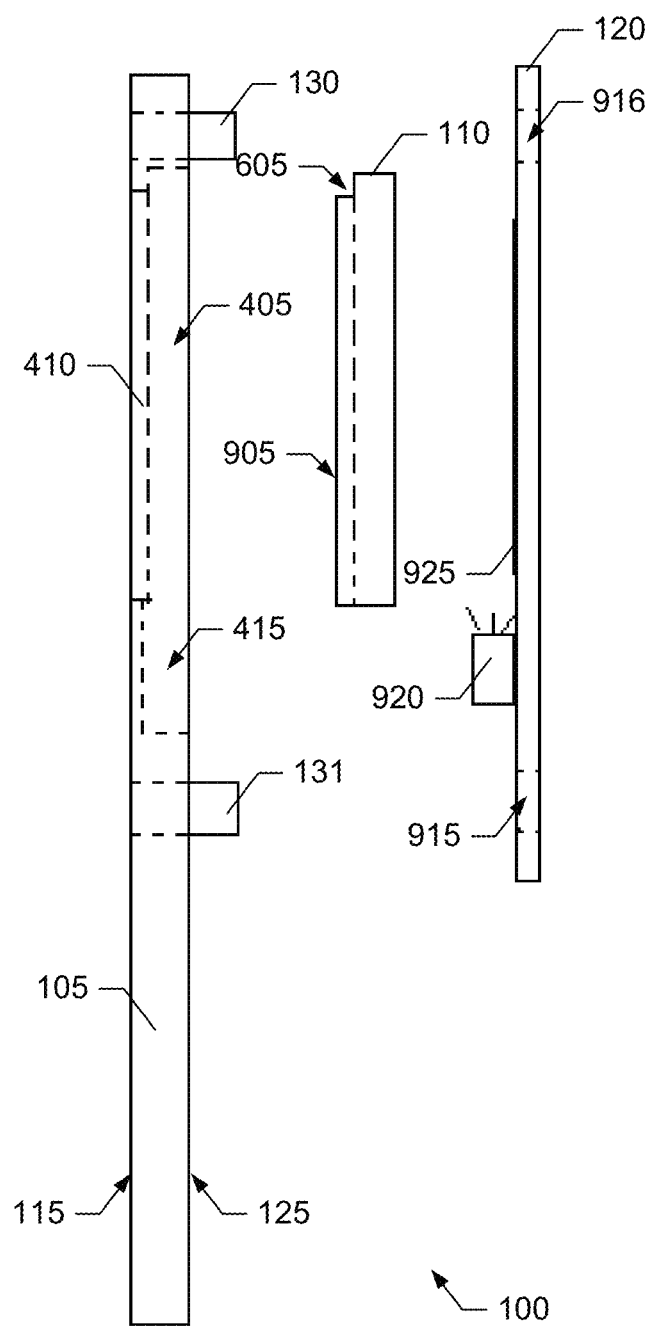
FIG. 9 is an exploded side-view of the appliance display of FIGS. 1-3.

FIGS. 1-3 depict an example appliance display 100 constructed in accordance with the teachings of this disclosure. The example appliance displays disclosed herein may be used with any number and/or type(s) of appliances such as, but not limited to, refrigerators, washing machines, dryers, dishwashers, stoves, and microwaves.

The example appliance display 100 includes a frame 105 having openings defined therethrough into which individual and/or separate light guides (two of which are designated with reference numerals 110 and 111) are inserted. As described below in connection with FIGS. 4 and 5, the frame 105 includes ledges 410 which prevent the light guides 110-111 from passing through a front surface 115 of the frame 105.

As shown in FIGS. 1-3, the frame 105 may include fastening and/or snapping features (two of which are designated with reference numerals 106 and 107) to assembly the appliance display 100 to other elements of an appliance.

To reduce parts inventory and/or to obtain more favorable part costs, the light guides 110-111 may be substantially identical, and/or may be selected from a relatively small set of light guides. By using multiple units of the same light guide in a particular appliance display, and/or using light guides selected from a small set of light guides in multiple appliance displays for a variety of appliances, costs associated with the light guides 110-111 can be reduced. That is, the modular light guides 110-111 disclosed herein can be reused across and within appliance displays. In contrast, the traditional use of light guide sheets requires the custom manufacture of a light guide sheet for each appliance display.

To secure the light guides 110-111 in the frame 105, a printed circuit board 120 is secured to a rear surface 125 of the frame 105 by one or more heat stakes (two of which are designated with reference numerals 130 and 131). As discussed below in connection with FIG. 9, side-fire light emitting diodes 920 on the surface of the printed circuit board 120 are positioned to emit light into respective ones of the light guides 110-111. The light emitted by the light emitting diodes 920 is diffused by the light guides 110-111 and emitted though respective openings in the frame 105.

To provide illuminated display elements having differing shapes, sizes and/or colors even when the light guides 110-111 are identical or selected from a small set of options, a label 135 is affixed to the front surface 115 of the frame 105. The label 135 has openings (one of which is designated with reference numeral 140) defined therein to define the desired display elements.

The example appliance display 100 of FIG. 1 includes trim 145, however, the trim 145 may be omitted depending on application.

FIGS. 4 and 5 are top- and side-views of the example frame 105 of FIGS. 1-3. The example frame 105 has openings (two of which are designated with reference numerals 405 and 406) defined therethrough into which respective light guides 110-111 can be inserted and/or positioned. Each of the openings 405-406 includes a ledge 410 that prevents the light guides 110-111 from being able to pass through the front surface 115 of the frame 105.

Each of the openings 405-406 has a corresponding opening (two of which are designated with reference numerals 415 and 416) to allow a respective side-fire light emitting diode 905 (see FIG. 9) mounted on the printed circuit board 120 to emit light into respective light guides 110-111.

FIGS. 6-8 are top-, end- and side-views of the example light guides 110-111 of FIGS. 1-3. As shown in FIGS. 6-8, the light guides 110-111 are formed to have a lip 605 corresponding to the ledges 410 to prevent the light guides 110-111 from being able to pass through the front surface 115 of the frame 105. Example dimensions for the light guides 110-111 are 10×10 mm, 20×20 mm, 30×30 mm, etc.

To diffuse light emitted into the end or side of the light guides 110-111, the light guides 110-111 are formed of a material having a density that increases further away from the end or side into which a respective light emitting diode 905 emits light into the light guide 110, 111. By diffusing the light, light emitted by the light guides 110-111 through the openings 405-406 can be substantially consistent and/or uniform across the surface of the light guides 110-111.

FIG. 9 is an exploded side-view of the example appliance display 100 of FIGS. 1-8. To assemble the example appliance display 100, the light guide 110 is inserted through the back surface 125 of the frame 105 into the opening 405. The lip 605 of the light guide 110 engages the ledge 410 of the opening 405 to prevent the light guide 110 from passing through the front surface 115 of the frame 105. When inserted, a top surface 905 of the light guide 110 is substantially coplanar with the front surface 115 of the frame 105.

To hold the light guide 110 in place, the printed circuit board 120 is affixed to the frame 105 by heat stakes 130-131 that pass through corresponding holes 905 and 906 defined in the printed circuit board 120.

When the printed circuit board 120 is affixed to the frame 105, a side-fire light emitting diode 920 mounted on the printed circuit board 120 is positioned in the opening 415 to enable the light emitting diode 920 to emit light into the end or side of the light guide 110.

While not shown in FIG. 9, the label 135 is affixed to the front surface 115 of the frame 105.

To provide capacitive touch capability, the printed circuit board 120 may include a capacitive touch point 925. The capacitive touch point 925 can be activated through the label 135 and the light guide 110.

Although certain example methods, apparatus and articles of manufacture have been described herein, the scope of coverage of this patent is not limited thereto. On the contrary, this patent covers all methods, apparatus and articles of manufacture fairly falling within the scope of the claims of this patent.

What is claimed is:

1. An appliance display comprising:
    a printed circuit board having a side-fire light emitting diode attached to a surface of the printed circuit board;
    a frame having a plurality of heat stakes to operatively connect the printed circuit board to the frame; and
    a light guide inserted into an opening defined in the frame, the light guide held in place in the opening,
    wherein the light guide guides light emitted by the side-fire light emitting diode through the opening defined in the frame,
    wherein the printed circuit board retains the light guide in the opening when the printed circuit board is heat staked to the frame; and
    wherein the light guide is formed from a material having a density that increases further away from an edge of the light guide into which the side-fire light emitting diode emits light such that the light emitted through the opening by the light guide is substantially uniform across the opening.

2. An appliance display as defined in claim 1, wherein the light guide is molded.

3. An appliance display as defined in claim 1, wherein the frame comprises a ledge, and the light guide comprises a lip, wherein the lip engages the ledge when the light guide is positioned in the frame.

4. An appliance display as defined in claim 1, further comprising a second light guide inserted into a second opening defined in the frame,
    wherein the second light guide is to guide light emitted by a second side-fire light emitting diode through the second opening defined in the frame,
    wherein the printed circuit board retains the second light guide in the second opening when the printed circuit board is heat staked to the frame.

5. An appliance display as defined in claim 4, wherein the second light guide is substantially identical to the light guide.

6. An appliance display as defined in claim 4, wherein the second light guide is not connected to the light guide.

7. An appliance display as defined in claim 1, wherein the frame comprises a second opening defined therein to enable the side-fire light emitting diode to be positioned next to the edge of the light guide, and to enable the side-fire light emitting diode to emit the light into the edge of the light guide.

8. An appliance display as defined in claim 1, further comprising a label affixed to the frame, the label defining a pattern of light emitted through the opening by the light guide.

9. An appliance display as defined in claim 1, further comprising at least one of a fastener or a snapping feature to assemble the appliance display to an appliance housing.

10. A method to assemble an appliance display, the method comprising:
    attaching a side-fire light emitting diode to a surface of a printed circuit board;
    inserting a light guide formed from a material having a density that increases further away from an edge of the light guide into which the side-fire light emitting diode emits light such that the light emitted through the opening by the light guide is substantially uniform across the opening into an opening defined in a frame;
    holding the light guide held in place in the opening by heat staking the printed circuit board to the frame using heat stakes of the frame,
    wherein light emitted by the side-fire light emitting diode is emitted through the opening via the light guide, and
    wherein the printed circuit board retains the light guide in the opening when the printed circuit board is heat staked to the frame.

11. A method as defined in claim 10, further comprising positioning the printed circuit board so that the side-fire light emitting diode is positioned in a second opening defined in the frame and next to the edge of the light guide.

12. A method as defined in claim 10, wherein the frame comprises a ledge, and the light guide comprises a lip, wherein the lip engages the ledge when the light guide is inserted into the frame.

13. A method as defined in claim 10, further comprising inserting a second light guide into a second opening defined in the frame, wherein the second light guide is to guide light emitted by a second side-fire light emitting diode on the printed circuit board through the second opening defined in the frame,
    wherein the printed circuit board retains the second light guide in the second opening when the printed circuit board is heat staked to the frame.

14. A method as defined in claim 13, wherein the second light guide is substantially identical to the light guide.

15. A method as defined in claim 13, wherein the second light guide is not connected to the light guide.

16. A method as defined in claim 10, further comprising affixing a label to the frame, the label defining a pattern of light emitted through the opening by the light guide.

* * * * *